United States Patent
Iqbal et al.

(10) Patent No.: US 7,986,252 B1
(45) Date of Patent: Jul. 26, 2011

(54) SYSTEM AND METHOD FOR REMOVING GLITCHES FROM A BIT STREAM

(75) Inventors: Asif Iqbal, Allahabad (IN); Girraj K. Agrawal, Noida (IN); Ankit Pal, Ghaziabad (IN)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/688,907

(22) Filed: Jan. 17, 2010

(51) Int. Cl.
*H03M 13/00* (2006.01)

(52) U.S. Cl. .......................................... 341/94; 341/55

(58) Field of Classification Search .................. 341/94, 341/95, 55; 375/340, 371, 354
See application file for complete search history.

(56) References Cited

U.S. PATENT DOCUMENTS

| 5,748,034 A | 5/1998 | Ketineni et al. |
| 7,180,966 B2 * | 2/2007 | Vallet et al. ................. 375/340 |
| 7,447,254 B1 * | 11/2008 | Mack et al. ................. 375/146 |

* cited by examiner

Primary Examiner — Brian Young
(74) Attorney, Agent, or Firm — Charles Bergere

(57) ABSTRACT

A bit stream is received and each bit corresponding to the bit stream is over-sampled to generate a first set of data samples. Each data sample from the first set of data samples is compared with a corresponding immediate previous data sample to generate a second set of data samples. The second set of data samples is compared with bit masks, and accordingly, some of the data samples in the first set of data samples are identified for replacement. Further, a substitute data sample is selected from the first set of data samples based on a predefined criterion and some of the data samples in the first set of data samples are replaced with the substitute data sample.

18 Claims, 12 Drawing Sheets

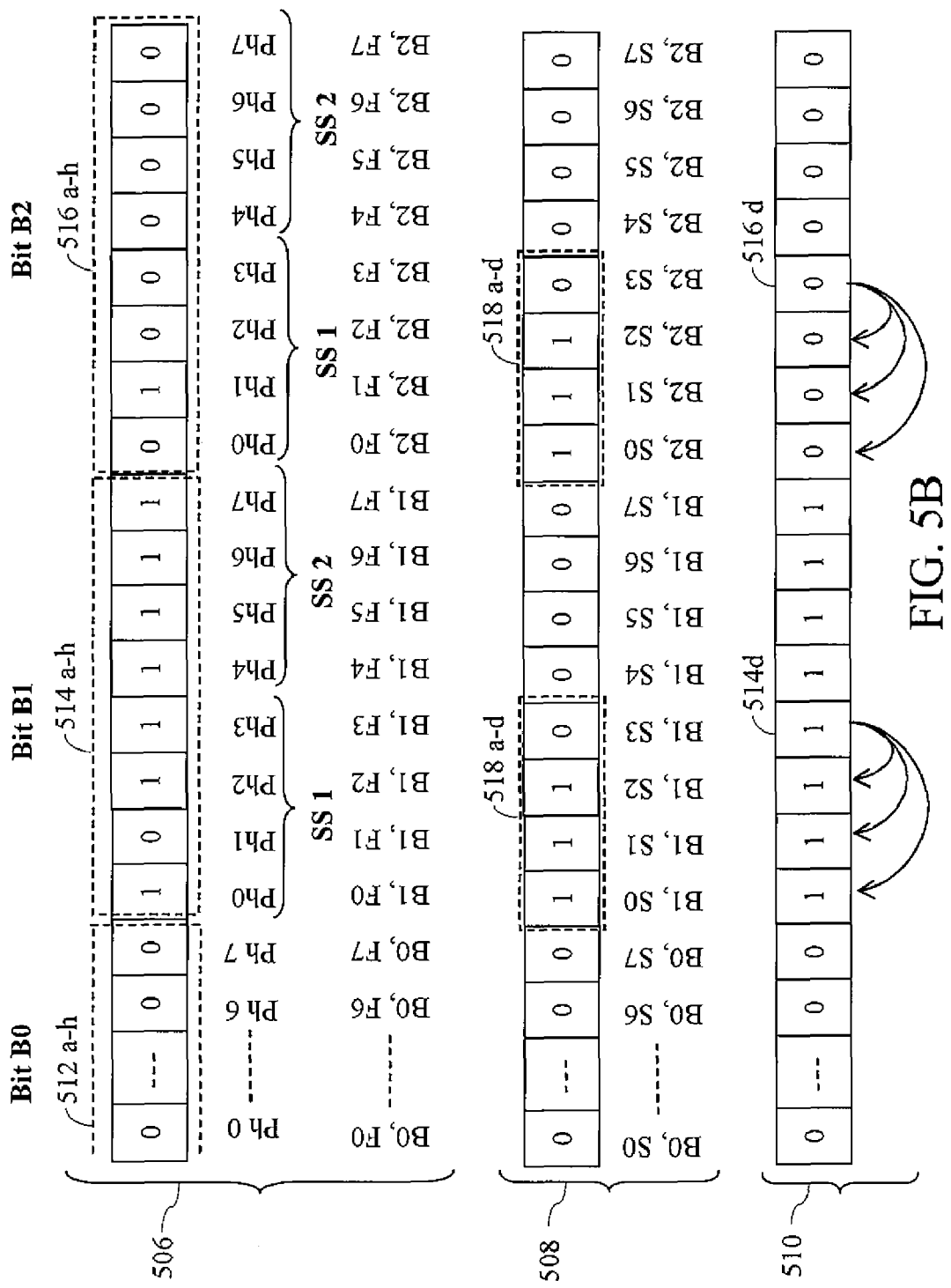

SYSTEM AND METHOD FOR REMOVING GLITCHES FROM A BIT STREAM

BACKGROUND OF THE PRESENT INVENTION

The present invention relates generally to data processing and communication systems, and, more specifically, to a system and method for removing glitches from a bit stream of serially transmitted data.

Electrical circuits generally operate in noisy environments. There are numerous sources that may introduce noise in input or output signals of electrical circuits, for example, reflection due to impedance mismatch between a source and load circuit, inductive and capacitive coupling in the circuit, crosstalk between signal lines, ringing, inter symbol interference (ISI) and other sources of disturbances. Such sources may generate unwanted components in the input or output signals of a transmitter or receiver circuit.

In serial communication systems, a data signal is transmitted serially through a transmission channel and noise from different sources adds glitches to the data signal. The serially transmitted data signal is received at the receiver and includes serially arranged data bits. Each data bit sent through the transmission channel is represented by a high or low voltage level for a predetermined time period or 'bit duration', resulting in logic values 1 and 0, respectively. Due to noise and other unwanted components as mentioned above, the logic low signal may overshoot during a bit transition for a short duration and produce a positive glitch. Similarly, the logic high signal may undershoot during a bit transition for a short duration and produce a negative glitch. Due to the overshoots and undershoots, the glitches occur near the bit transitions. However, glitches can occur anywhere in the bit duration due to other sources of disturbances, as mentioned above. For example, glitches can occur at the start, end or in the middle of the received bit stream.

Glitches may result in the wrong determination of the transmitted data bits that are received at the receiver. That is, a logic high signal sent by the transmitter may be determined as logic low and a logic low signal sent by the transmitter may be determined as logic high by the receiver. Thus, the glitches result in a high bit error rate (BER), and degrade the performance of the electrical circuit. Thus, if the glitches in the data signal are not removed, the overall function of the circuit is hampered and erroneous output may be produced.

Existing glitch removal circuits have several drawbacks. For one, they use delay-circuits to remove glitches from a bit stream. Drawbacks in such delay-circuit based glitch removal circuits will be explained in conjunction with FIGS. 1 and 2.

Referring now to FIG. 1A, a circuit diagram illustrating a conventional glitch removal circuit 100 is shown. The glitch removal circuit 100 includes a first combinational delay circuit 104a, a second combinational delay circuit 104b, and first and second NAND gates 108a and 108b. The first and second NAND gates 108a and 108b are connected in series. An input bit stream 102 is provided to a first input of the first NAND gate 108a. The input bit stream 102 is also provided to the first combinational delay circuit 104a and an output 106 of the first combinational delay circuit 104a is provided to a second input of the first NAND gate 108a. An output 110 of the first NAND gate 108a is provided to a first input of the second NAND gate 108b and to the second combinational delay circuit 104b. An output 112 of the second combinational delay circuit 104b is provided to a second input of the second NAND gate 108b.

FIGS. 1B and 1C illustrate first and second timing diagrams of various signals of the conventional glitch removal circuit 100. FIG. 1B shows the input bit stream 102; intermediate signals 106, 110, and 112; and an output signal 114. In this example, the input bit stream 102 includes a transition from a logic 1 to a logic 0 that has a positive or high glitch 'G' in the middle of the input bit stream 102. The first combinational delay circuit 104a introduces a delay 'd1' in the input bit stream 102 to generate the intermediate signal 106. The first NAND gate 108a performs a NAND operation on the input bit stream 102 and the intermediate signal 106 to generate the intermediate signal 110. The second combinational delay circuit 104b introduces a delay 'd2' in the intermediate signal 110 and generates the intermediate signal 112. The total delay introduced by the first and second combinational delay circuits 104a and 104b in the input bit stream 102 is 'd2−d1'. Finally, the second NAND gate 108b performs a NAND operation on the intermediate signals 110 and 112 to generate the output signal 114. In this case, to remove the glitch from the input bit stream 102, delay 'd1' introduced by the first combinational delay circuit 104a needs to be greater than the duration of the glitch 'G', i.e., d1>G. Additionally, the delay 'd2' introduced by the second combinational delay circuit 104b needs to be greater than the sum of the delay d1 and the duration of the glitch 'G', i.e., d2>d1+G. Thus, the combinational delay circuits 104a and 104b have to be designed specifically to meet the above-mentioned requirements.

The glitch is removed from the input bit stream 102 after performing the steps above and the output signal 114 is a glitch-free bit stream. However, the bit width L of the input bit stream 102 has been shortened to bit width L', that is the bit width has been shortened by a width equal to 'd2−d1'. Similarly, if there is a negative or low glitch in the middle of the input bit stream 102 then the bit width L' is elongated by a width equal to 'd2−d1' (see FIG. 1C). This is undesirable because bit width alterations may lead to a high BER at the receiver.

FIG. 1D is another example of a negative glitch in the input bit stream 102. In FIG. 1C, the glitch occurred near the middle of the input bit stream 102 while in FIG. 1D, the glitch occurs closer to a bit transition of the input bit stream 102. Referring to FIG. 1D, the input bit stream 102 includes a transition from a logic 0 to a logic 1 that has a negative or low glitch 'G' near the beginning of the transition end in the input bit stream 102. The first combinational delay circuit 104a introduces a delay 'd1' in the input bit stream 102 to generate the intermediate signal 106. The first NAND gate 108a performs a NAND operation on the input bit stream 102 and the intermediate signal 106 to generate the intermediate signal 110. The second combinational delay circuit 104b introduces a delay 'd2' in the intermediate signal 110 and generates the intermediate signal 112. Finally, the second NAND gate 108b performs a NAND operation on the intermediate signals 110 and 112 to generate the output signal 114. As shown in FIG. 1D, a glitch G' occurs near the transition end in the output signal 114. The glitch in the input signal occurs at a distance X from the transition end, where the value of X is less than the total delay introduced by the first and second combinational delay circuits 104a and 104b (i.e. X<d1+d2). Thus, the glitch G has not been removed from the input bit stream 102 after performing the steps above and the output signal 114 includes the glitch G'.

It is evident from FIG. 1D, that the conventional glitch removal circuit 100 cannot remove glitches that are present near the transition ends of the signal received at the receiver. Further, it is evident from FIGS. 1B and 1C that the conventional glitch removal circuit 100 alters the bit width while removing glitches present near the middle of the signal received at the receiver. Additionally, in order to remove glitches from the input bit stream there are specific design requirements in the conventional glitch removal circuits.

Referring now to FIG. 2A, a block diagram illustrating another conventional glitch removal circuit 200 is shown. FIG. 2A includes three sequential delay circuits 204a, 204b, and 204c; an XOR gate 210; and a multiplexer 214 (hereinafter "mux 214"). Additionally, a single clock input (not shown in FIG. 2A) is connected to the three sequential delay circuits 204a, 204b, and 204c. The three sequential delay circuits 204a, 204b, and 204c; the XOR gate 210; and the mux 214 are connected in series. An input bit stream 202 is provided to an input of the first sequential delay circuit 204a and an output 206 of the first sequential delay circuit 204a is provided to the second sequential delay circuit 204b. The output 206 is also provided to a first input of the XOR gate 210 and to a first input of the mux 214. Further, an output 208 of the second sequential delay circuit 204b is provided to a second input of the XOR gate 210 and an output 212 of the XOR gate 210 is provided to a second input of the mux 214. The second input to the mux 214 is a control signal that is provided to a select line of the mux 214. An output 216 of the mux 214 is provided to the third sequential delay circuit 204c. Lastly, an output 218 of the third sequential delay circuit 204c is provided to a second input of the mux 214.

FIG. 2B is a timing diagram illustrating various signals in the conventional glitch removal circuit 200. FIG. 2B shows the input bit stream 202; intermediate signals 206, 208, and 212; and an output signal 218. The first sequential delay circuit 204a receives the input bit stream 202, which is generated by oversampling an input bit stream using an oversampling unit (not shown). The input bit stream 202 represents the bit stream that includes a transition from a bit 0 to a bit 1, and there is a negative glitch G near the transition end in the input bit stream 202. The first and second sequential delay circuits 204a and 204b generate the intermediate signals 206 and 208, respectively.

If the intermediate signals 206 and 208 have the same logic values, then the intermediate control signal 212 is logic low, and the intermediate signal 206 is provided as the output of the mux 214 to generate the intermediate signal 216. However, if the intermediate signals 206 and 208 have different logic values, then the intermediate control signal 212 is logic high, and the current output signal 218 is provided as the output 216 of the mux 214.

The third unit delay circuit 204c introduces a unit delay in the intermediate signal 216 to generate the output signal 218, which is fed back to the mux 214. The mux 214 holds the output at the previous logic value of the input bit stream 202 during bit transitions in the input bit stream 202 and updates the output when there is no bit transition in the input bit stream 202. The sequential delay circuits 204a, 204b, and 204c store previous and present values of the input bit stream 202 to be used by the mux 214. Thus, the glitch in the input bit stream 202 is removed by maintaining the previous logic value, i.e. high or low at the output signal 218 during the bit transitions in the input bit stream 202 and updating the new logic value at the output signal 218 during the bit non-transitions in the input bit stream 202. However, a major shortcoming of the conventional glitch removal circuit 200 is that the bit width L in the input bit stream 202 is shortened to bit width L' in the output signal 216.

Data processing and communication systems based on serial data transmission are particularly sensitive to glitches. High-Speed serial interfaces, such as Mobile Industry Processor Interface (MIPI), Serial AT Attachment (SATA), Universal Serial Bus (USB) 3.0, and Peripheral Component Interconnect (PCI) Express, use various clock and data recovery schemes. These clock and data recovery schemes rely on accurate detection of bit boundaries. Therefore, the clock and data recovery schemes are particularly sensitive to glitches. Additionally, for error free clock and data recovery and to maintain low BER at the receiver of the High-Speed serial interfaces, the input bit stream provided to the clock and data recovery circuit should include bits of equal widths (i.e., no shortening or elongation of bit widths) corresponding to logic low and logic high data.

The conventional glitch removal circuits undesirably alter the bit widths while removing glitches from the received bit stream. Consequently, the probability of recovering correct data at the receiver by the clock and data recovery circuit decreases. It is desirable that the glitch removal circuits remove glitches of variable width and glitches that occur anywhere during the bit duration. Further, the delay introduced by the delay elements in the conventional glitch removal circuits varies with process, voltage, and temperature (PVT) variations, and hence, glitch removal operation is sensitive to the operating range of the circuit. It would be advantageous to have a glitch removal circuit that is independent of PVT variations. It also would be desirable to have a glitch removal circuit that can remove variable width glitches and does not alter the bit width of the input bit stream.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

FIG. 5B is a diagram illustrating data samples corresponding to a bit stream in accordance with an embodiment of the present invention;

DETAILED DESCRIPTION OF THE INVENTION

Figure 1A:
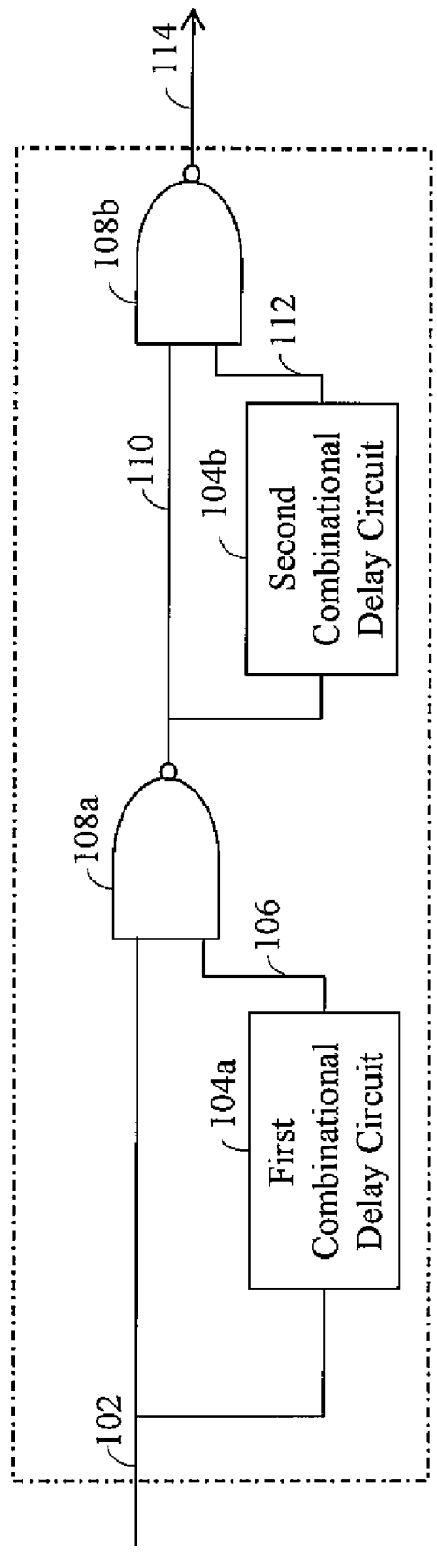
FIG. 1A is a schematic block diagram of a first conventional glitch removal circuit.
Figure 1B:
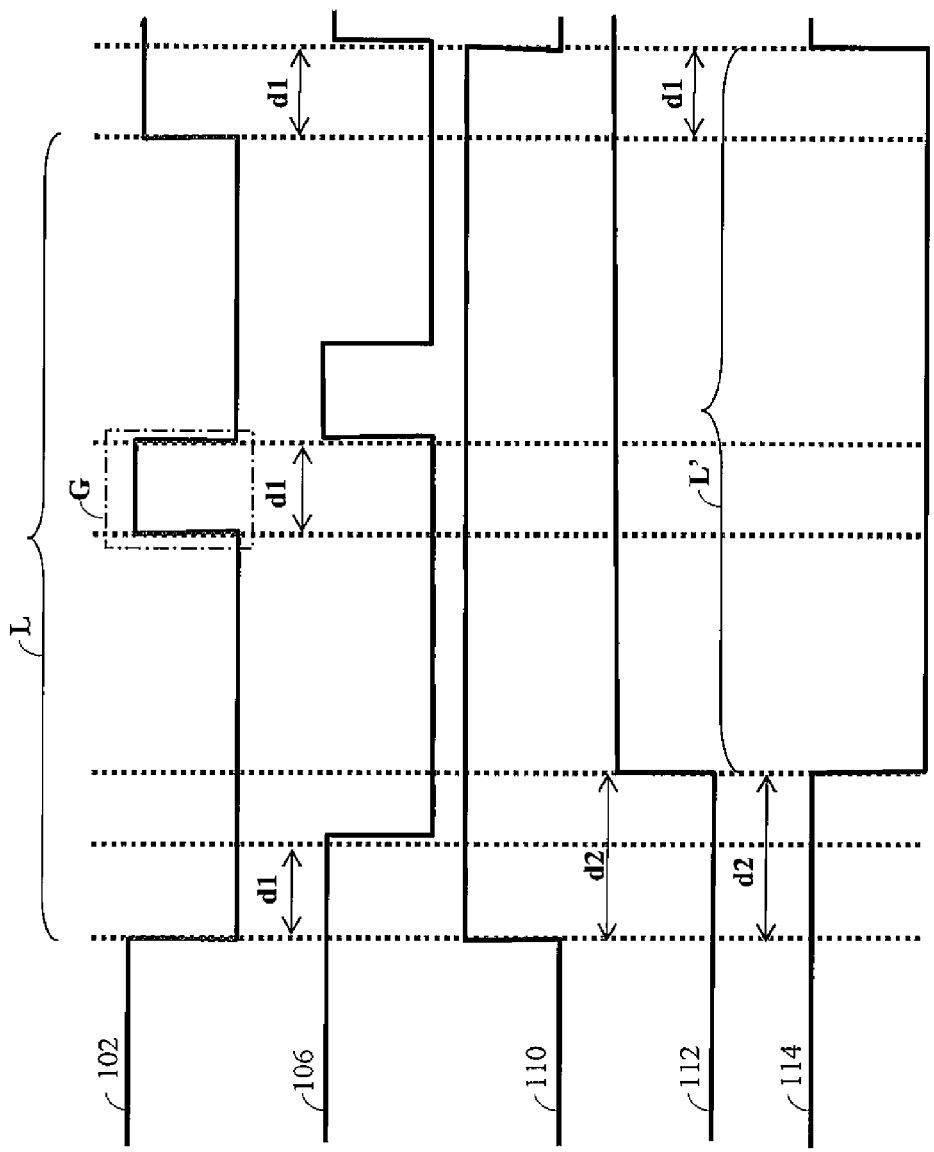
FIGS. 1B, 1C and 1D are timing diagrams illustrating various signals of the conventional glitch removal circuit of FIG. 1.
Figure 1C:
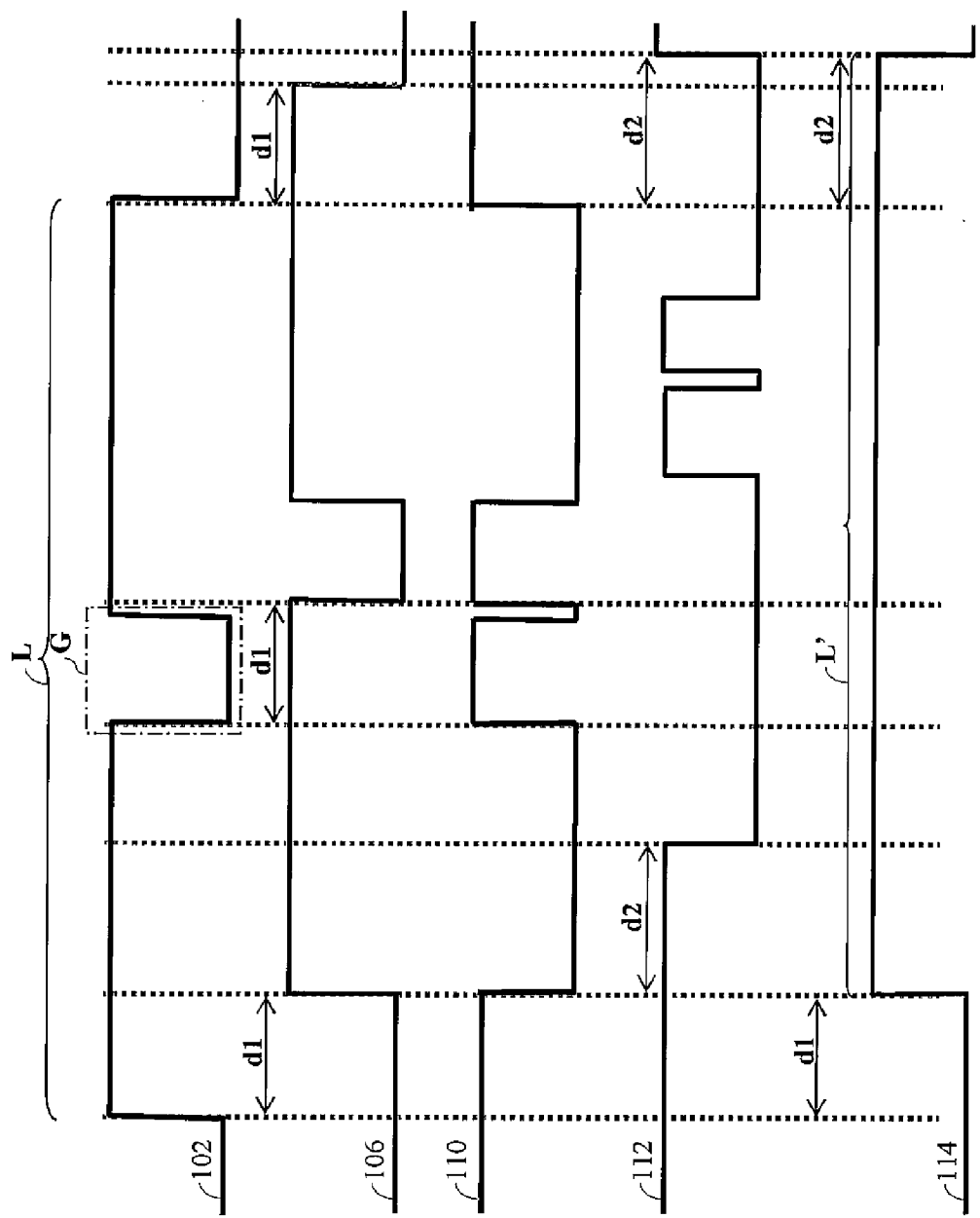
Figure 1D:
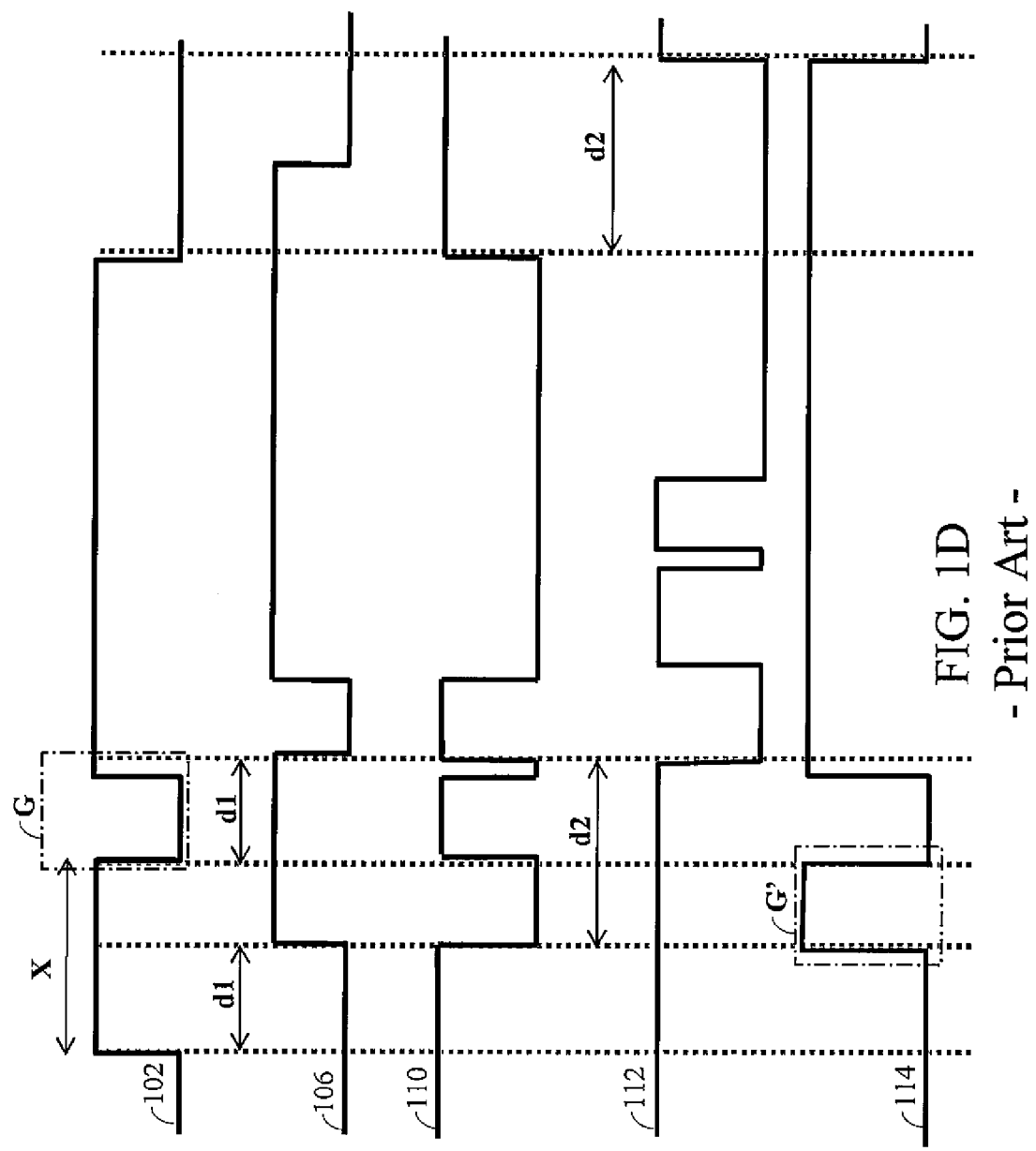
Figure 2A:
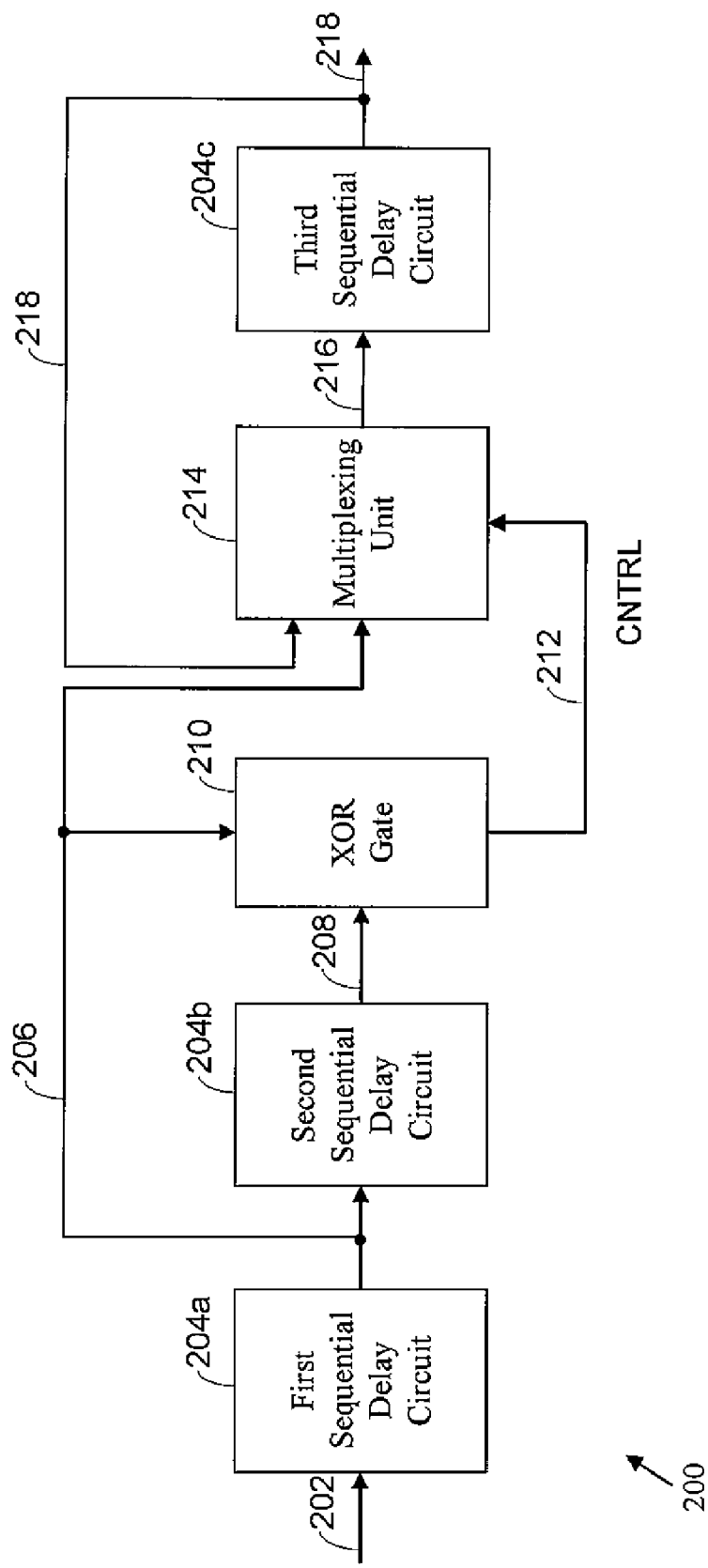
FIG. 2A is a schematic block diagram of a second conventional glitch removal circuit.
Figure 2B:
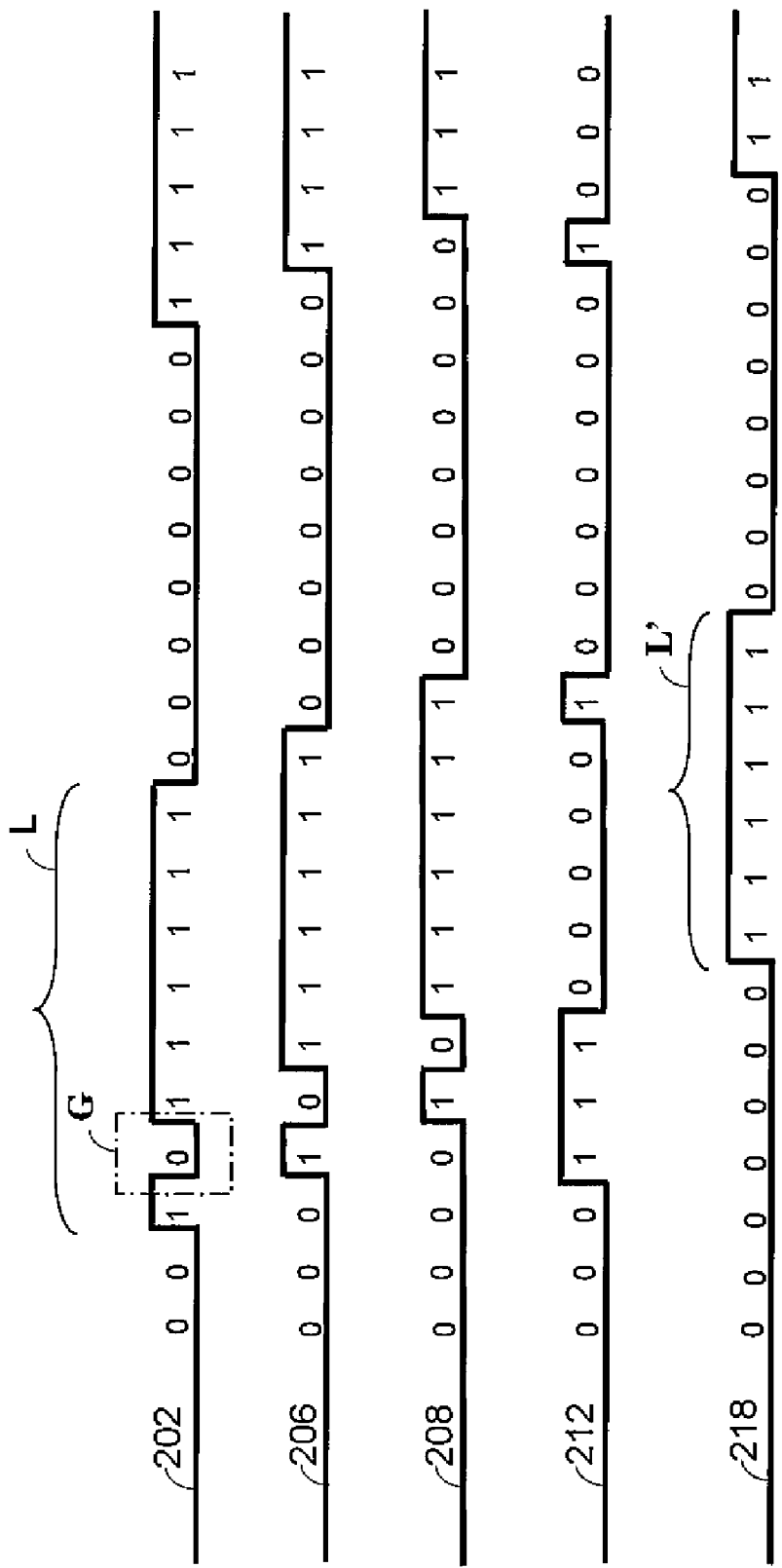
FIG. 2B is a timing diagram illustrating various signals of the second conventional glitch removal circuit shown in FIG. 2A.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In accordance with an embodiment of the present invention, a method for removing glitches from a bit stream is provided. An input bit stream is over-sampled using a plurality of sampling phases of a reference clock to generate a first set of data samples. Each data sample in the first set of data samples is compared with a corresponding previous data sample to generate a second set of data samples. The second set of data samples is compared with one or more predefined bit masks to determine the location of any glitches and then one or more data samples in the first set of data samples are identified for replacement. A substitute data sample is selected from the first set of data samples based on a predefined criterion. Subsequently, one or more data samples in the first set of data samples are replaced with the substitute data sample.

In accordance with another embodiment of the present invention, a system for removing glitches from a bit stream is provided. The system includes an oversampling unit for oversampling a bit stream using a plurality of sampling phases of a reference clock. The oversampling unit generates a first set of data samples. A bit-transition detecting unit is connected to the oversampling unit and compares each data sample in the first set of data samples with a corresponding previous data sample to generate a second set of data samples. The second set of data samples is used for detecting bit transitions in the first set of data samples. A glitch detecting unit connected to the bit-transition detecting unit compares the second set of data samples with one or more predefined bit masks to identify one or more data samples in the first set of data samples for replacement. A glitch filtering unit connected to the glitch detecting unit selects a substitute data sample from the first set of data samples based on a predefined criterion and replaces the one or more identified data samples in the first set of data samples with the substitute data sample.

In accordance with yet another embodiment of the present invention, a receiver for recovering clock and data from a bit stream is provided. The receiver includes an oversampling unit for receiving the bit stream and oversampling the received bit stream using a plurality of phases of a reference clock signal. The oversampling unit generates a first set of data samples. A serial-to-parallel data converter converts a serial stream of the first set of data samples into a plurality of parallel streams of data samples. A glitch removal circuit connected to the serial-to-parallel data converter removes glitches from the bit stream. The glitch removal circuit includes a bit-transition detecting unit that compares each data sample in the first set of data samples with a corresponding previous data sample to generate a second set of data samples. A glitch detecting unit connected to the bit-transition detecting unit compares the second set of data samples with one or more predefined bit masks to identify one or more data samples in the first set of data samples for replacement. A glitch filtering unit connected to the glitch detecting unit selects a substitute data sample from the first set of data samples based on a predefined criterion and for replacing the one or more data samples in the first set of data samples with the substitute data sample. A clock and data recovery unit connected to the glitch removal circuit recovers clock and data from the plurality of parallel streams of glitch free data samples.

Various embodiments of the present invention provide a method and system for removing glitches from a bit stream in a data processing and communication system. The present invention can remove the glitches without any bit width alterations as in the case of delay circuits based glitch filtering methods. The system and method of the present invention can be used to implement an efficient clock and data recovery system. Further, the glitch filter circuit of the present invention helps to reduce the overall BER at a receiver of a serial communication system. Additionally, the system and method can be used in a number of applications where low BER is required. Further, the present invention efficiently removes glitches and is insensitive to PVT variations. The method and system of the present invention facilitate removal of variable width glitches and glitches that may occur anywhere during the bit duration, such as near the transition ends.

The present invention can be used in numerous applications where glitches of variable width may occur. The present invention is useful in applications related to data communication, image processing, video and audio signals processing, data processing systems, and the like. The present invention is particularly useful in clock and data recovery applications in high speed serial data transmission-based receivers used in data processing and communication system, for example, MIPI-MPHY, USB 3.0, SATA, and PCI Express.

Figure 3:
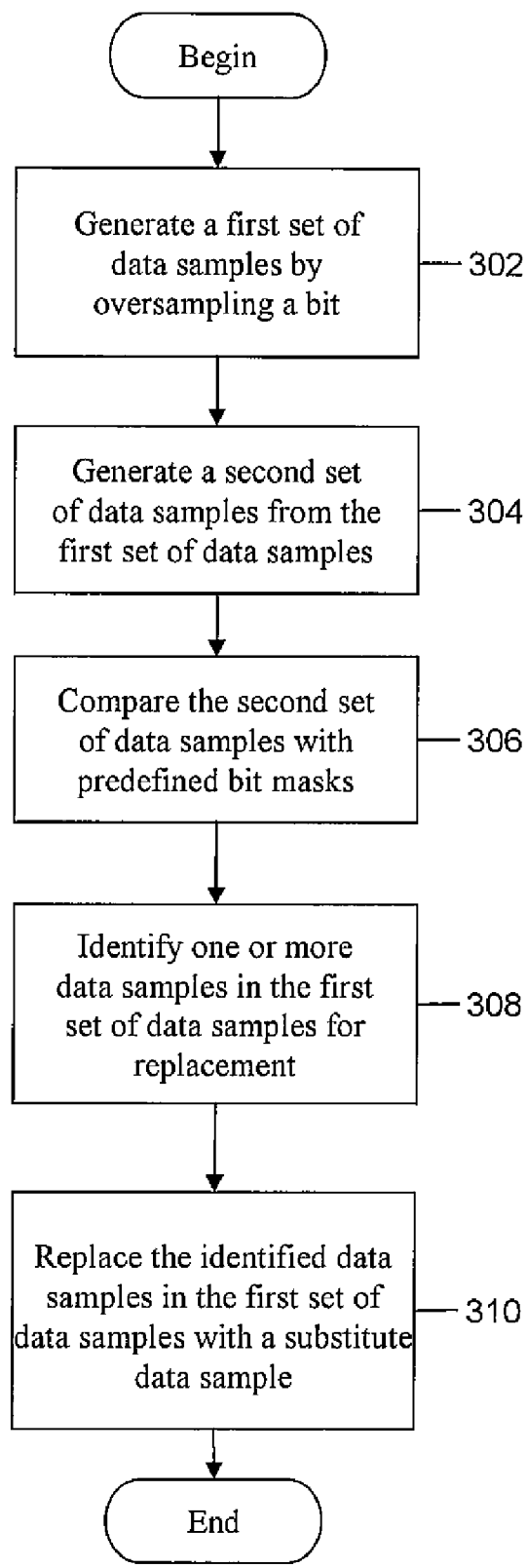
FIG. 3 is a flowchart illustrating a method for removing glitches from a bit stream in a data processing and communication system in accordance with an embodiment of the present invention.

Referring now to FIG. 3, a flowchart illustrating a method for removing glitches from a bit stream in a data processing and communication system in accordance with an embodiment of the present invention is shown.

Generally, a serial data transmission system includes a transmitter module, a receiver module, and a transmission channel. The transmitter module transmits data serially over the transmission channel. The transmitted data does not include a clock signal. The receiver module receives the serial bit stream and recovers data from the received serial bit stream. The receiver module also performs a serial-to-parallel conversion to obtain parallel data streams. The parallel data streams assist the receiver module in operating at lower frequencies than the serial data transmission rate.

In serial data transmission, the serial bit stream that is received at the receiver module is pre-encoded by the transmitter module using one of many standard encoding schemes, for example, 8b/10b encoding. The encoding scheme ensures a minimum and sufficient number of transitions in the bit stream. In accordance with various embodiments of the present invention, the transmitter and receiver modules may be a part of a wide area network. Alternatively, these modules may comprise integrated circuits located either on a single circuit board or on different circuit boards, or may be two IP blocks within the same chip. The transmission channel may be a satellite communication link, a fiber optic cable, a back plane connector, a chip-to-chip interconnect, and the like.

The bit stream is received at the receiver and includes serially arranged bits B0, B1, B2, B3, and so on. At step 302, a first set of data samples is generated by oversampling each bit in the bit stream using a plurality of sampling phases of a reference clock. The oversampling of each serially arranged bit is performed at the receiver module. Oversampling each bit B0, B1, B2, B3 . . . to generate a first set of data samples will be explained in detail in conjunction with FIGS. 5A and 5B.

In one example, each bit of the bit stream is over-sampled using eight sampling phases (Ph 0 to Ph 7) of the reference clock signal. A bit B1 having a binary value 1 received in the bit stream is over-sampled using eight sampling phases and a set of eight data samples—{1, 0, 1, 1, 1, 1, 1, 1}—is produced. In this example, the data sample having a binary value 0 represents a glitch, and the set of eight data samples {1, 0, 1, 1, 1, 1, 1, 1} corresponds to the first set of data samples. The first set of data samples is converted into a plurality of parallel streams of data samples by a serial-to-parallel data converter.

At step 304, a second set of data samples is generated by comparing each data sample of the first set of data samples with a corresponding previous data sample. In a preferred embodiment of the invention, the immediately preceding data sample is used for the comparison. For example, a data sample of bit B1 corresponding to Ph 5 is compared with a data sample of bit B1 corresponding to Ph 4 in the first set of data samples. In another example, a data sample of bit B1 corresponding to Ph 0 is compared with a data sample of bit B0 corresponding to Ph 7 in the first set of data samples. In this case, the first data sample is compared with the last data sample of the immediately preceding bit from the first set of data samples. The comparison of data samples to generate the second set of data samples will be explained in more detail in conjunction with FIG. 5B.

At step 306, the second sets of data samples are compared with one or more predefined bit masks. A starting data sample is identified corresponding to a position where the predefined bit masks match the second set of data samples. Subsequently, at step 308, one or more data samples in the first set of data samples are identified for replacement based on the comparison of the second set of data samples with the one or more predefined bit masks. The starting data sample in the first set of data samples corresponds to a start position where the predefined bit mask matches the second set of data samples. One or more data samples following the starting data sample are identified for replacement.

In accordance with various embodiments of the present invention, the predefined bit masks may be any desired pattern that is able to remove variable width glitches. The predefined bit masks may be a collection of any number and pattern of bits. For example, the predefined bit masks include SEQ_1={1, 1, 1, 0} and SEQ_2={1, 1, 0, 0}. In the example discussed earlier, in the first set of data samples corresponding to bit B1—{1, 0, 1, 1, 1, 1, 1, 1}, four data samples starting from the first data sample are identified for replacement. The criteria used to identify the one or more data samples for replacement in the first set of data samples will be explained in detail in conjunction with FIGS. 4A and 4B, and FIGS. 5A and 5B.

At step 310, the identified one or more data samples in the first set of data samples are replaced with a substitute data sample. In one example, a data sample that is separated from the starting data sample by a predefined number of phases is selected as the substitute data sample. The substitute data sample is separated from the starting data sample by a predefined number of phases, and therefore has a high probability of being in a glitch free region. After replacing the one or more data samples in the first set of data samples, the resultant set of data samples is free from glitches. This resultant glitch-free set of data samples is temporarily stored in a memory buffer from where it may be retrieved for subsequent processing. The criteria used to determine the substitute data sample will be described in more detail in conjunction with FIGS. 4A and 4B, and FIGS. 5A and 5B.

Figures 4A, 4B:
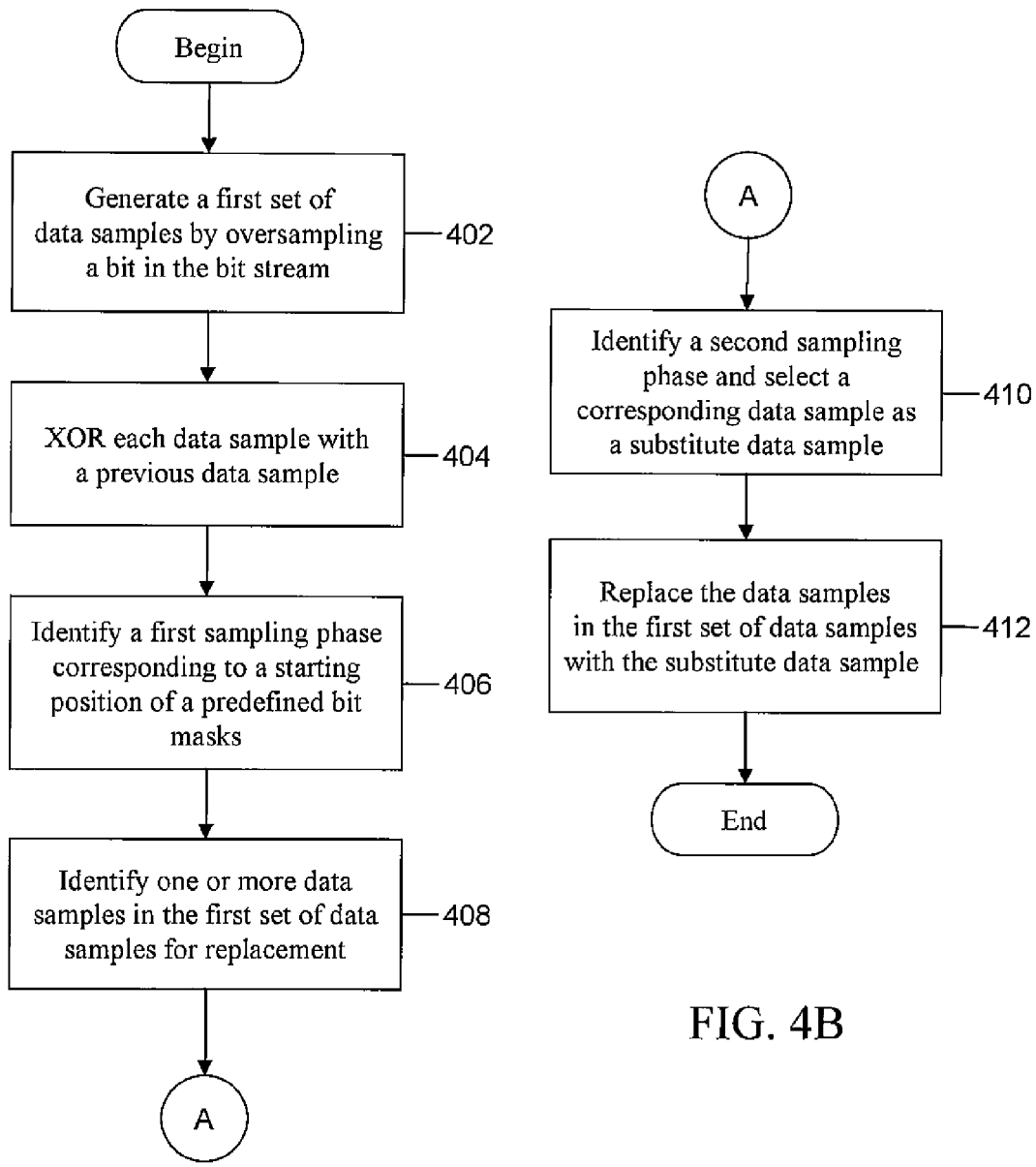
FIGS. 4A and 4B are flowcharts illustrating a method for removing glitches from a bit stream in a data processing and communication system in accordance with another embodiment of the present invention.

Referring now to FIGS. 4A and 4B, a flowchart illustrating a method for removing glitches from a bit stream in a data processing and communication system in accordance with an another embodiment of the present invention is shown.

At step 402, a first set of data samples is generated through oversampling each bit in the bit stream using a plurality of sampling phases of a reference clock.

In accordance with one embodiment of the present invention, the sampling phases of the reference clock are partitioned into a plurality of sets of sampling phases. Further, each of the plurality of sets of sampling phases comprises one or more sampling phases. In accordance with various embodiments of the present invention, any desired number of sampling phases may be used for oversampling the bit stream, and the sampling phases may be partitioned into any desired number of sets of sampling phases.

In one example, a total of eight sampling phases, Ph 0, Ph 1, Ph 2, Ph 3, Ph 4, Ph 5, Ph 6, and Ph 7, are used to generate eight data samples for each bit. The eight phases are partitioned into two sampling sets, and each sampling set includes four phases SS_1={Ph 0-Ph 3} and SS_2={Ph 4-Ph 7}. However, it will be apparent to a person of ordinary skill in the art that a sampling set may include any combination of phases. For example, each sampling set may include four phases where SS_1={Ph 2-Ph 5} and SS_2={Ph 6-Ph 1}. Partitioning eight data samples to generate two sampling sets will be explained in more detail in conjunction with FIG. 5B.

At step 404, an XOR operation is performed on each data sample of the first set of data samples with a previous data sample to generate a second set of data samples. In a preferred embodiment of the invention, the previous data sample used is the immediately preceding data sample.

At step 406, a first sampling phase corresponding to a starting position of at least one of the one or more predefined bit masks in the second set of data samples is identified.

In accordance with an alternative embodiment of the present invention, a predefined number of a second set of data samples is associated with each data sample in the first set of data samples, in accordance with the width of the predefined bit masks. In one example, four data samples in the second set of data samples are associated with each data sample in the first set of data samples. Thus, (B1, S0), (B1, S1), (B1, S2), and (B1, S3) are associated with (B1, F0). Similarly, (B1, S6), (B1, S7), (B2, S0), and (B2, S1) are associated with (B1, F6). Associating each data sample from the first set of data samples with a second set of data samples will be explained in more detail in conjunction with FIG. 5B. The associated four data samples in the second set of data samples are compared with the predefined bit masks. If the four data samples match one of the predefined bit masks, the associated data sample in the first set of data samples is identified as a first data sample and the phase corresponding to the first data sample is identified as the first sampling phase.

At step 408, one or more data samples in the first set of data samples are identified for replacement. In accordance with an embodiment of the present invention, the data sample corresponding to the first sampling phase and one or more sampling phases following the first sampling phase in a set of sampling phases comprising the first sampling phase are identified for replacement.

At step 410, a second sampling phase is identified and a data sample from the first set of data samples corresponding to the second sampling phase is selected as a substitute data sample for replacing the one or more data samples in the first set of data samples. The second sampling phase is identified from one of the sets of sampling phases, such that the second sampling phase is separated from the first sampling phase by a predefined number of phases. At step 412, the one or more data samples in the first set of data samples are replaced with the substitute data sample.

In accordance with various embodiments of the present invention, the data samples corresponding to each set of sampling phases are independently processed using the steps above. Further, the independently processed data samples are collated to generate parallel stream of filtered data samples.

Figure 5A:
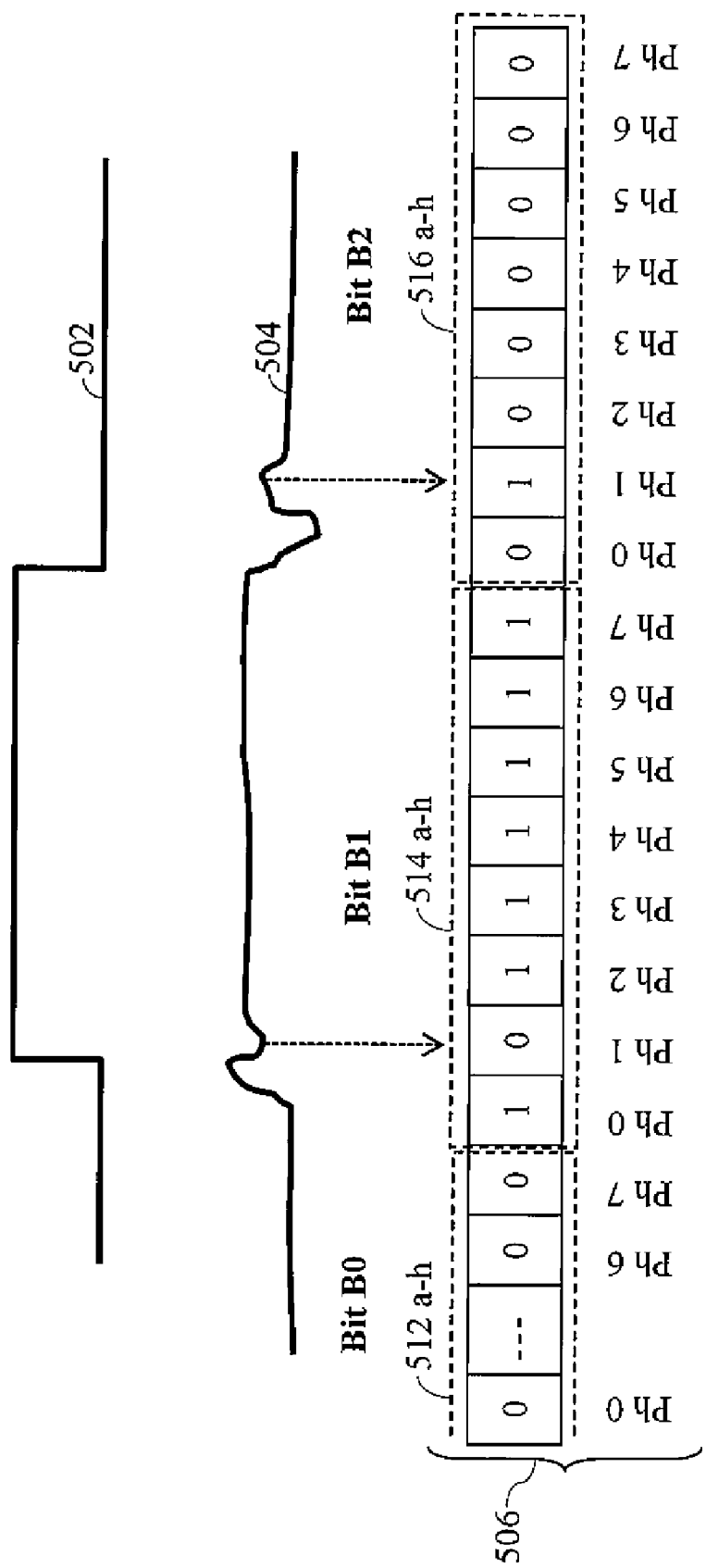
FIG. 5A depicts ideal and actual waveforms of a bit stream and oversampled data samples corresponding to the actual waveform.

Referring now to FIG. 5A, ideal and actual waveforms of a bit stream and oversampled data samples corresponding to the actual waveform are depicted in accordance with an embodiment of the present invention. FIG. 5A shows waveforms 502 and 504, and a first set of data samples 506 corresponding to the waveform 504. The waveform 502 corresponds to an ideal waveform of a bit stream transmitted by a transmitter, and waveform 504 corresponds to an actual waveform of the bit stream. The bit stream is over-sampled using a plurality of sampling phases of a reference clock to generate the first set of data samples 506. Further, each bit, i.e. Bits B0, B1, B2, etc. is oversampled using a plurality of sampling phases of the reference clock. Note that the actual waveform includes two glitches, one positive and one negative (due to overshoots and undershoots), that effect the data samples 506. The first set of data samples 506 shows a negative glitch at Ph 1 of bit B1 and a positive glitch at Ph 1 of bit B2.

Referring now to FIG. 5B, another diagram illustrating the data samples 506 of FIG. 5A is shown. FIG. 5B also shows a second set of data samples 508, and a glitch-free set of data samples 510. The first set of data samples includes data samples corresponding to bits B0, B1 and B2, indicated at 512a-h, 514a-h, and 516a-h, respectively. A predefined bit mask in the second set of data samples 508 is indicated at 518a-d.

In the example shown in FIG. 5B, a total of eight sampling phases (Ph 0-Ph 7) are used to generate eight data samples for each bit in the bit stream. The eight phases are partitioned into two sampling sets and each sampling set includes four phases SS_1={Ph 0-Ph 3} and SS_2={Ph 4-Ph 7}.

As discussed with reference to FIG. 4A, a XOR operation is performed on each data sample of the first set of data samples 506 with a corresponding previous data sample to generate a second set of data samples 508. In the preferred embodiment, the immediately preceding set of data samples is XORed with the current set of data samples. The XOR operation is performed using the following expression: (B1, S0)=[(B1, F0) XOR (B0, F7)]; (B1, S1)=[(B1, F1) XOR (B1, F0)]; etc. In this expression, F0 and F7 are data samples from the first set of data samples corresponding to Ph 0 of SS_1 and Ph 3 of SS_2 respectively. Similarly, S0 and S1 are data samples from the second set of data samples corresponding to F0 and F1 (as shown in FIG. 5B). The following is the bit stream obtained corresponding to bit B1 using the expression mentioned above.

{Bit B0 [F7], Bit B1 [F0], Bit B1 [F1] . . . . Bit B1 [F7]}=[0, 1, 0, 1, 1, 1, 1, 1]
{Bit B1 [S0], Bit B1 [S1] . . . Bit B1 [S7]}=[1, 1, 1, 0, 0, 0, 0, 0].

The second set of data samples is compared with two predefined bit masks, namely, SEQ_1={1, 1, 1, 0} and SEQ_2={1, 1, 0, 0}. The two predefined bit masks are selected to filter glitch corresponding to the second and subsequent data sample in each of the sampling sets. For example, for sampling sets "1011", "1110" glitch '0' is identified using the two predefined bit basks. For bit B1, the predefined bit masks matches in the second set of data samples starting from (B1, S0). Thus data sample (B1, F0) is identified as first data sample and the corresponding phase, i.e. Ph 0, is selected as the first sampling phase. The first data sample (B1, F0) and the following data samples in SS_1, namely, (B1, F1), (B1, F2), and (B1, F3), are identified for replacement.

A second sampling phase is selected from the eight sampling phases, such that the second sampling phase is separated from the first sampling phase by a predefined number of phases.

As shown in FIG. 5B, Ph 3, which is separated by two phases from the first sampling phase, is selected as the second sampling phase. The data sample corresponding to Ph 3 is selected as the substitute data sample, and four data samples in the first set of data samples are replaced with the substitute data sample. Further, the four data samples include the substitute data sample. Additionally, the substitute data sample lies in the middle of the oversampled bit stream and empirically has a very low probability of being a glitched data sample. This method is repeated for each set of data samples corresponding to each bit received in the bit stream. For example, the steps above are repeated for each sampling set of Bit B2 and so on.

In another example, for bit B1, the bit masks match the second set of data samples starting from (B1, S3). The corresponding phase, i.e., Ph 3, is selected as the first sampling phase and the corresponding data sample, i.e., (B1, F3), is selected for replacement. Since the data sample (B1, F3) is the last data sample in set SS_1, therefore, only one data sample is identified for replacement. Thereafter, a second sampling phase is selected from the eight sampling phases. Further, phase 0 of SS_1 and phase 2 of SS_2, which are separated by two phases from the first sampling phase, are suitable for selection as the second sampling phase. In accordance with an embodiment of the present invention, in case two sampling phases are suitable for selection as the second sampling phase, then selection of the second sampling phase depends on the distance of the second sampling phase from the bit boundary. In this example, of the two sampling phases, phase 2 of SS_2 is farther from the bit boundary than phase 0 of SS_1, and thus, phase 2 of SS_2 is selected as the second sampling phase. The data sample corresponding to phase 2 of SS_2, i.e. (B1, F6), is selected as the substitute data sample. Accordingly, the data sample selected for replacement (B1, F3) is replaced with the substitute data sample (B1, F6).

In accordance with another embodiment of the present invention, the one or more sampling phases in each sampling set are independently labeled. For example, the four phases in sampling set SS_1, namely, Ph 0, Ph 1, Ph 2, and Ph 3, are labeled as Q0, Q1, Q2, and Q3, respectively. Similarly, the four phases in sampling set SS_2, namely, Ph 0, Ph 1, Ph 2, and Ph 3, are also labeled as Q0, Q1, Q2, and Q3, respectively. The value of Q is determined that corresponds to the first sampling phase. '4-Q' data samples from the first set of data samples are identified for replacement, starting from the data sample corresponding to the first sampling phase. For example, if the starting position of the one or more predefined bit masks in the second set of data samples is (SS_1; Q1), the sampling phase corresponding to (SS_1; Q1) is selected as the first sampling phase. Thereafter, a total of three (4-Q) data samples starting from (SS_1; Q1) are identified for replacement.

Further, the sampling phase corresponding to (SS_2; Q0), which is separated from the first sampling phase by two phases (Q+3) and lies in the middle of the oversampled bit, is selected as the second sampling phase and the data sample corresponding to (SS_2; Q0) is selected as the substitute data sample.

Figure 6:
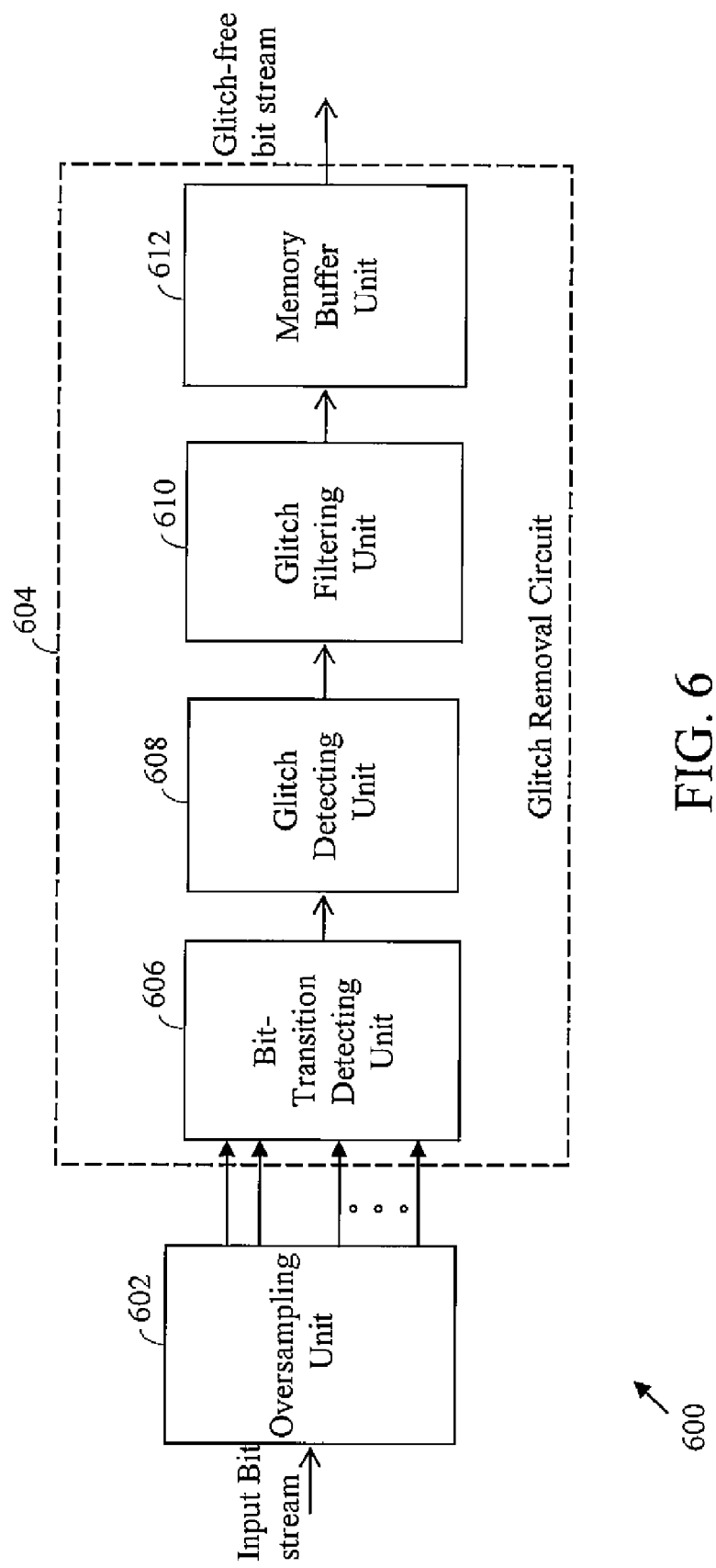
FIG. 6 is a schematic block diagram illustrating a glitch removal circuit in accordance with an embodiment of the present invention.

Referring now to FIG. 6, a block diagram of a glitch removal system 600 including an over sampling unit 602 and a glitch removal circuit 604 in accordance with an embodiment of the present invention is shown. The glitch removal circuit 604 includes a bit-transition detecting unit 606, a glitch detecting unit 608, a glitch filtering unit 610, and a memory buffer unit 612.

The oversampling unit 602 over samples a bit stream using a plurality of sampling phases of a reference clock and generates a first set of data samples. Each bit in the bit stream is over sampled using the plurality of sampling phases. The first set of data samples is converted into a plurality of parallel streams of data samples by a serial-to-parallel data converter (not shown).

In accordance with one embodiment of the present invention, the sampling phases of the reference clock are partitioned into a plurality of sets of sampling phases and each of the plurality of sets of sampling phases includes one or more sampling phases.

The bit-transition detecting unit 606 is connected to the over sampling unit 602 and receives data samples in the first set of data samples and compares each data sample in the first set of data samples with a corresponding previous data sample to generate a second set of data sample. In the presently preferred embodiment, the immediately previous data sample is used for the comparison.

The glitch detecting unit 608 is connected to the bit-transition detecting unit 606 and compares the second set of data samples with one or more predefined bit masks to mark one or more data samples in the first set of data samples for replacement. The glitch detecting unit 608 identifies a first sampling phase corresponding to a starting position of at least one of the one or more predefined bit masks in the second set of data samples. The first sampling phase is identified from each set of sampling phases for the first set of data samples corresponding to the bit. Further, the glitch detecting unit 608 identifies for replacement one or more data samples in the first set of data samples corresponding to the first sampling phase and the one or more sampling phases, following the first sampling phase in the set of sampling phases that includes the first sampling phase.

The glitch filtering unit 610 is connected to the glitch detecting unit 608 and selects a second sampling phase from one of the plurality of sets of sampling phases, such that the second sampling phase is separated from the first sampling phase by a predefined number of phases. The data sample corresponding to the second sampling phase is selected as the substitute data sample. Thereafter, the glitch filtering unit 610 replaces the one or more data samples in the first set of data samples with the substitute data sample. The output of the glitch filtering unit 610 is a glitch-free bit stream that is then stored in the memory buffer unit 612.

In accordance with an embodiment of the present invention, multiple glitch removal circuits may be arranged in parallel to process data samples corresponding to multiple sampling sets. For example, M bits in a bit stream are oversampled using N sampling phases to obtain M sets of data samples, in which each set of data samples includes N data samples. A serial-to-parallel data converter converts the M sets of data samples into M parallel streams of N data samples, and generates an M×N matrix of data samples. In one example, M=10 and N=8; thus, the serial-to-parallel data converter generates a matrix of eighty data samples. Multiple glitch removal circuits 604 are arranged in parallel, such that each glitch removal circuit 604 receives data samples corresponding to a set of sampling phases for the bits in the bit stream. If the eight sampling phases are partitioned into two sets of sampling phases, there may be twenty glitch removal circuits arranged in parallel to process the eighty data samples, each glitch removal circuit processing four data samples.

Figure 7:
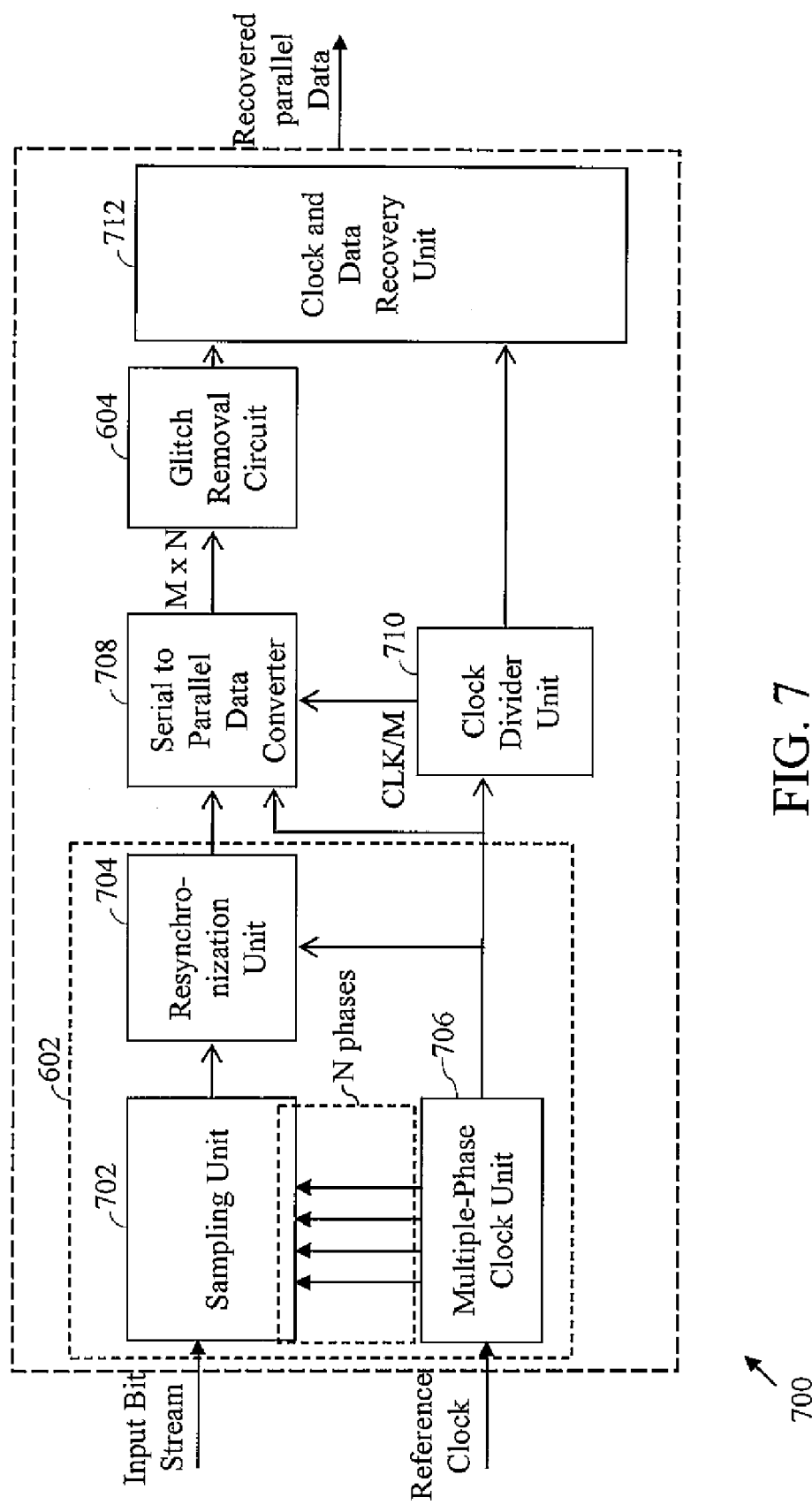
FIG. 7 is a schematic block diagram illustrating a receiver system in accordance with an embodiment of the present invention.

Referring now to FIG. 7, a block diagram illustrating a receiver system 700 in accordance with an embodiment of the present invention is shown. The receiver system 700 includes an oversampling unit 602, a serial-to-parallel data converter 708, a clock divider unit 710, a glitch removal circuit 604, and a clock and data recovery unit 712. The oversampling unit 602 includes a sampling unit 702, a resynchronization unit 704, and a multiple-phase clock unit 706.

The sampling unit 702 receives the bit stream and oversamples each bit of the received bit stream using a plurality of phases of a reference clock signal to generate a first set of data samples. The multiple-phase clock unit 706 generates the plurality of phases of a reference clock signal. In accordance with one embodiment of the present invention, the multiple-phase clock unit generates eight phases of a reference clock signal. Further, the multiple-phase clock unit 706 includes a delay locked loop (DLL), a phase locked loop (PLL), an interpolator, or a combination of the DLL, the PLL, and the interpolator to generate the eight phases of a reference clock signal.

The resynchronization unit 704 receives the over-sampled data samples from the sampling unit 702 and synchronizes the sampling instants of the one or more sets of data samples. For example, the resynchronization unit 704 synchronizes the sampling instants in the first and the subsequent sets of data samples. Since data samples in each set of data samples are obtained at different time instants corresponding to a clock signal of the reference clock, the resynchronization unit 704 time shifts the various obtained data samples to align them to the clock signal. As a result, the data samples that belong to one reference clock signal are aggregated in a synchronized set of data samples. Similarly, one or mores set of data samples are aggregated in synchronized sets of data samples.

The oversampling unit 602 provides the sets of data samples to the serial-to-parallel data converter 708. The serial-to-parallel data converter 708 converts a serial stream of the first set of data samples into a plurality of parallel streams of data samples, as explained in conjunction with FIG. 6.

The clock divider unit 710 is provided with one of the multiple phases of the reference clock signal generated by the multiple-phase clock unit 706 as a first clock signal. Thereafter, the clock divider unit 710 converts the first clock signal into a second clock signal having a lower frequency as compared with the first clock signal. In accordance with an embodiment of the present invention, a second clock signal is generated that has a frequency equal to 1/M of the first clock signal. The second clock signal is provided to the serial-to-parallel data converter 708 and the clock and data recovery unit 712 to synchronize the transfer of the M parallel streams of the sets of data samples between the serial-to-parallel data converter 708, and the clock and data recovery unit 712. Additionally, the serial to parallel converter data converter 708 generates M parallel streams of sets of data samples from a serial stream of set of data samples generated by the oversampling unit 602. Further, the M parallel streams generated out of M×N data samples are provided to the glitch removal circuit 604, connected to the serial-to-parallel data converter 708. The glitch removal circuit 604 removes glitches from the bit stream. The working of the glitch removal circuit 604 is explained in detail in conjunction with FIG. 6. Lastly, the clock and data recovery unit 712, connected to the glitch removal circuit 604, recovers clock and data from the one or more parallel streams of sets of data samples.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

What is claimed is:

1. A method for removing glitches from a bit stream, comprising:
   generating a first set of data samples by over-sampling each bit in the bit stream using a plurality of sampling phases of a reference clock;
   generating a second set of data samples based on comparison of the first set of data samples with a corresponding previous data sample;
   comparing the second set of data samples with at least one predefined bit mask;
   identifying at least one data sample in the first set of data samples for replacement based on comparison of the second set of data samples with the at least one predefined bit mask; and
   replacing the identified at least one data sample in the first set of data samples with a substitute data sample, wherein the substitute data sample is selected from the first set of data samples based on a predefined criterion, and
   wherein the plurality of sampling phases are partitioned into a plurality of sets of sampling phases, each of the plurality of sets of sampling phases comprising one or more sampling phases.

2. The method for removing glitches from a bit stream of claim 1, wherein the step of generating a second set of data samples comprises performing an XOR operation on each data sample in the first set of data samples with a corresponding immediate previous data sample.

3. The method for removing glitches from a bit stream of claim 1, further comprising identifying a first sampling phase corresponding to a starting position of at least one of the at least one predefined bit mask in the second set of data samples, wherein the first sampling phase is identified for each set of sampling phases of the over-sampled bit.

4. The method for removing glitches from a bit stream of claim 3, wherein one or more data samples in the first set of data samples corresponding to at least one of the first sampling phase and the one or more sampling phases following the first sampling phase in a set of sampling phases, are identified for replacement.

5. The method for removing glitches from a bit stream of claim 3, further comprising selecting a second sampling phase from one of the plurality of sets of sampling phases, wherein the second sampling phase is separated from the first sampling phase by a predefined number of phases.

6. The method for removing glitches from a bit stream of claim 5, further comprising selecting a data sample of the over-sampled bit corresponding to the second sampling phase as the substitute data sample.

7. A system for removing glitches from a bit stream, comprising:
   an oversampling unit for oversampling each bit in the input bit stream using a plurality of sampling phases of a reference clock to generate a first set of data samples;
   a bit-transition detecting unit, connected to the oversampling unit, for comparing the first set of data samples with a corresponding previous data sample and generating a second set of data samples;
   a glitch detecting unit, connected to the bit-transition detecting unit, for comparing the second set of data samples with at least one predefined bit mask to identify one or more data samples in the first set of data samples for replacement; and
   a glitch filtering unit, connected to the glitch detecting unit, for replacing the one or more data samples identified for replacement with a substitute data sample, wherein the substitute data sample is selected from the first set of data samples based on a predefined criterion, and
   wherein the plurality of sampling phases are partitioned into a plurality of sets of sampling phases, each of the plurality of sets of sampling phases comprising one or more sampling phases.

8. The system for removing glitches from a bit stream of claim 7, wherein the bit-transition detecting unit performs an XOR operation on the first set of data samples with the corresponding immediate previous data samples in the first set of data samples.

9. The system for removing glitches from a bit stream of claim 7, wherein the bit-transition detecting unit compares the one or more data samples corresponding to the over-sampled bit in accordance with the plurality of sets of sampling phases.

10. The system for removing glitches from a bit stream of claim 7, wherein the glitch detecting unit identifies a first sampling phase corresponding to a starting position of at least one of the at least one predefined bit mask in the second set of data samples, and the first sampling phase is identified for each set of sampling phases for the over-sampled bit.

11. The system for removing glitches from a bit stream of claim 10, wherein the glitch filtering unit identifies the one or more data samples of the bit corresponding to at least one of the first sampling phase and the one or more sampling phases following the first sampling phase in a set of sampling phases, and wherein the one or more data samples are identified for replacement.

12. The system for removing glitches from a bit stream of claim 10, wherein the glitch filtering unit further selects a second sampling phase from one of the plurality of sets of sampling phases, wherein the second sampling phase is separated from the first sampling phase by a predefined number of phases.

13. The system for removing glitches from a bit stream of claim 12, wherein the glitch filtering unit further selects a data sample of the over-sampled bit corresponding to the second sampling phase as the substitute data sample.

14. A receiver system for recovering clock and data from a bit stream in a serial data transmission system, comprising:
   an oversampling unit for receiving the bit stream and oversampling each bit of the bit stream using a plurality of phases of a reference clock signal to obtain a first set of data samples;
   a serial-to-parallel data converter, connected to the oversampling unit, for converting a serial stream of the first set of data samples into a plurality of parallel streams of data samples;
   a glitch removal circuit, connected to the serial-to-parallel data converter, for removing glitches in the bit stream, wherein the glitch removal circuit comprises:
      a bit-transition detecting unit for comparing each data sample in the first set of data samples with a corresponding previous data sample in the first set of data samples to generate a second set of data samples;
      a glitch detecting unit, connected to the bit-transition detecting unit, for comparing the second set of data samples with one or more predefined bit masks to identify one or more data samples in the first set of data samples for replacement; and a glitch filtering unit, connected to the glitch detecting unit, for replacing the one or more data samples identified for replacement, with a substitute data sample selected from the first set of data samples based on a predefined criterion; and a clock and data recovery unit, connected to the glitch removal circuit, for recovering clock and data from the first set of data samples.

15. The receiver system of claim 14, further comprising a multiple phase clock unit for generating the plurality of sampling phases of a reference clock, wherein the plurality of sampling phases are partitioned into a plurality of sets of sampling phases, and wherein each of the plurality of sets of sampling phases comprises one or more sampling phases.

16. The receiver system of claim 15, wherein the glitch detecting unit identifies a first sampling phase corresponding to a starting position of at least one of the one or more predefined bit masks in the second set of data samples, wherein the first sampling phase is identified for each set of sampling phases for the bit.

17. The receiver system of claim 16, wherein the glitch filtering unit identifies the one or more data samples of the bit corresponding to at least one of the first sampling phase and the one or more sampling phases following the first sampling phase in a set of sampling phases, wherein the one or more data samples are identified for replacement.

18. The receiver system of claim 17, wherein the glitch filtering unit further selects at least one sampling phase from one of the plurality of sets of sampling phases as a second sampling phase, wherein the second sampling phase is separated from the first sampling phase by a predefined number of phases.

* * * * *